April 21, 1964 YASUAKI KONDO ETAL 3,130,370
CIRCUIT SYSTEM FOR PREVENTING INTERFERING RADIATION
FROM TRANSISTOR SUPERHETERODYNE RECEIVERS
Filed Nov. 22, 1960
2 Sheets-Sheet 1

INVENTORS
Yasuaki Kondo
Makoto Takahashi
Akira Ichikawa
BY
Brumbaugh, Free, Graves & Donohue INVENTOR.
Yasuaki Kondo,
Makoto Takahashi
Akira Ichikawa
BY
Brumbaugh, Free, Graves & Donohue

United States Patent Office 3,130,370
Patented Apr. 21, 1964

3,130,370

CIRCUIT SYSTEM FOR PREVENTING INTERFERING RADIATION FROM TRANSISTOR SUPERHETERODYNE RECEIVERS

Yasuaki Kondo and Makoto Takahashi, Tokyo, and Akira Ichikawa, Sagamihara City, Japan, assignors to Japan Broadcasting Corporation, Tokyo, Japan Filed Nov. 22, 1960, Ser. No. 70,942
3 Claims. (Cl. 325—436)

This invention relates to improvements in the circuit system for preventing the interfering radiation of local oscillation from the transistor superheterodyne receivers.

The radiation of local oscillation from the superheterodyne receivers causes interference with other radio receivers working on the same or nearby channel.

The object of this invention is to provide a highly effective and stable circuit system for preventing local oscillation radiation from the superheterodyne transistor receiver tunable over a wide frequency band.

A greater part of the disturbing electric waves radiated from the superheterodyne receivers is mainly due to the local oscillation voltage induced on their input ends. Therefore, various vacuum tube reciever circuits have heretofore been proposed to prevent the interference, but in the case of transistor receivers, the same method as used in the vacuum tube receivers can not effectively operate owing to the characteristics of the transistors.

The present invention relates to a circuit system for preventing the interference radiation from the transistor receivers, and is characterized in that a part of the local oscillation voltage which is taken out of the biasing circuit of a frequency converter transistor circuit is applied to the input side of the first stage high frequency amplifying transistor circuit through a small capacitance, in such a manner that it will become opposite phase to the local oscillation voltage induced on the first stage input end of the receiver via a high frequency transformer connected between the said two transistor circuits and the interelectrode impedance of the high frequency amplifying transistor, thereby cancelling the interfering local oscillation voltage.

For a better understanding of this invention, reference is made to the accompanying drawing, in which.

Figure 5:
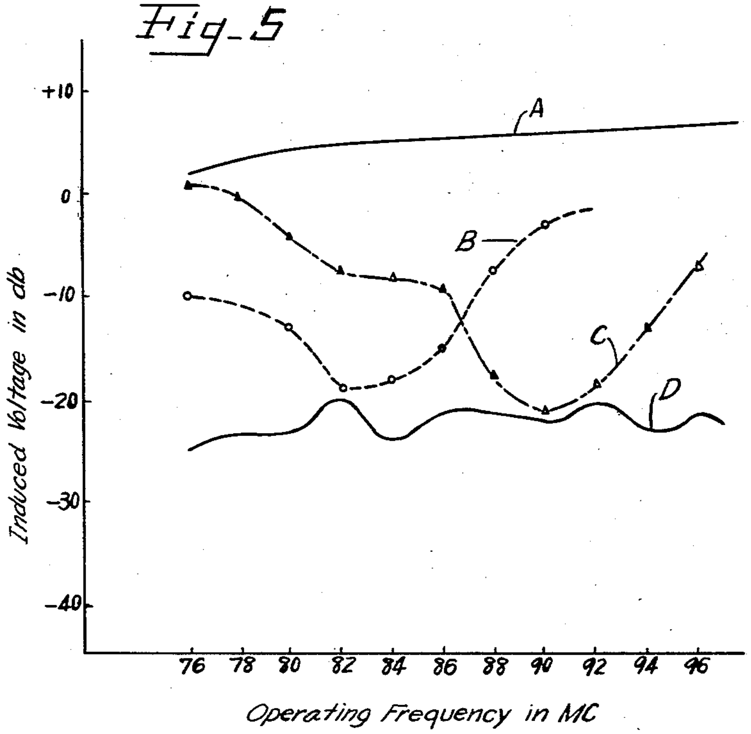
Figure 6A:
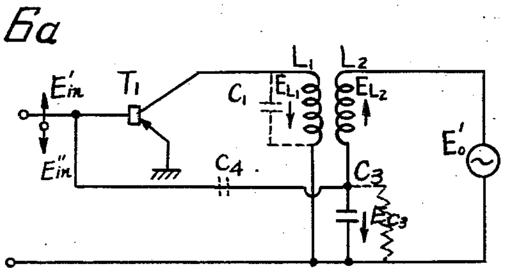
Figure 6B:
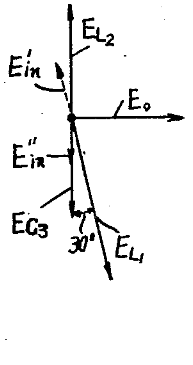

FIGS. 3–*a*, 3–*b* and 4 are diagrams for illustrating embodiments of the circuit arrangement for preventing interfering radiation from the transistor receivers, according to this invention;

FIG. 5 illustrates a comparative test result, as to the local oscillation induced voltage at the input terminals of the heretofore known circuits and the circuit of the present invention;

FIGS. 6–*a* and 6–*b* show equivalent circuit diagram and vector diagram thereof respectively for illustrating the principle of this invention.

Figure 1:
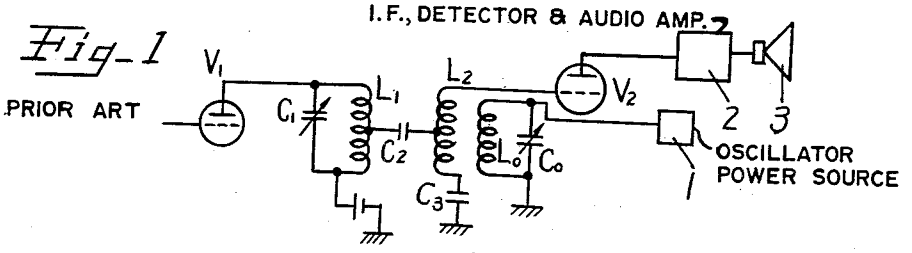
Fig 1 PRIOR ART
FIG. 1 is a diagram of a heretofore known vacuum tube type receiver circuit for preventing local oscillation radiation by the principle of bridge balancing.

The heretofore known circuit is as shown in FIG. 1, wherein a high frequency amplifying vacuum tube $V_1$, a mixing or frequency converting vacuum tube $V_2$, high frequency transformer primary and secondary windings $L_1$ and $L_2$ each connected to the vacuum tubes $V_1$ and $V_2$, condensers $C_1$, $C_2$ and $C_3$, an inductance $L_0$ and a variable condenser $C_0$ of a local oscillation circuit coupled to the winding $L_2$, an electric or power source 1 for energizing the local oscillation circuit $L_0C_0$, a receiver circuit 2 consisting of the intermediate frequency amplifier, the second detector and the audio amplifier, and a loud speaker 3 are connected as shown.

According to the heretofore known circuit as shown in FIG. 1, an intermediate tap on the secondary winding $L_2$ of the high frequency transformer provides a path between the high frequency amplifying tube $V_1$ and the mixing or frequency converting tube $V_2$ to feed the output of the amplifying tube $V_1$ to the tube $V_2$ and the capacitance of the condenser $C_3$ connected to the biasing circuit of the mixing or frequency converting tube $V_2$ is selected as an equivalent value to the input capacitance of the tube $V_2$ and the local oscillation circuit $L_0C_0$ is coupled to the transformer winding $L_2$, then the oscillation voltages generated therein are cancelled with each other, since the input capacitance of the tube $V_2$, the capacitance $C_3$ and two halves of transformer secondary winding $L_2$ constitute a balanced bridge circuit and no local oscillation voltage appears at the intermediate tap on the transformer winding $L_2$ and the preceding amplifying stage.

Figures 2, 3A, 3B:
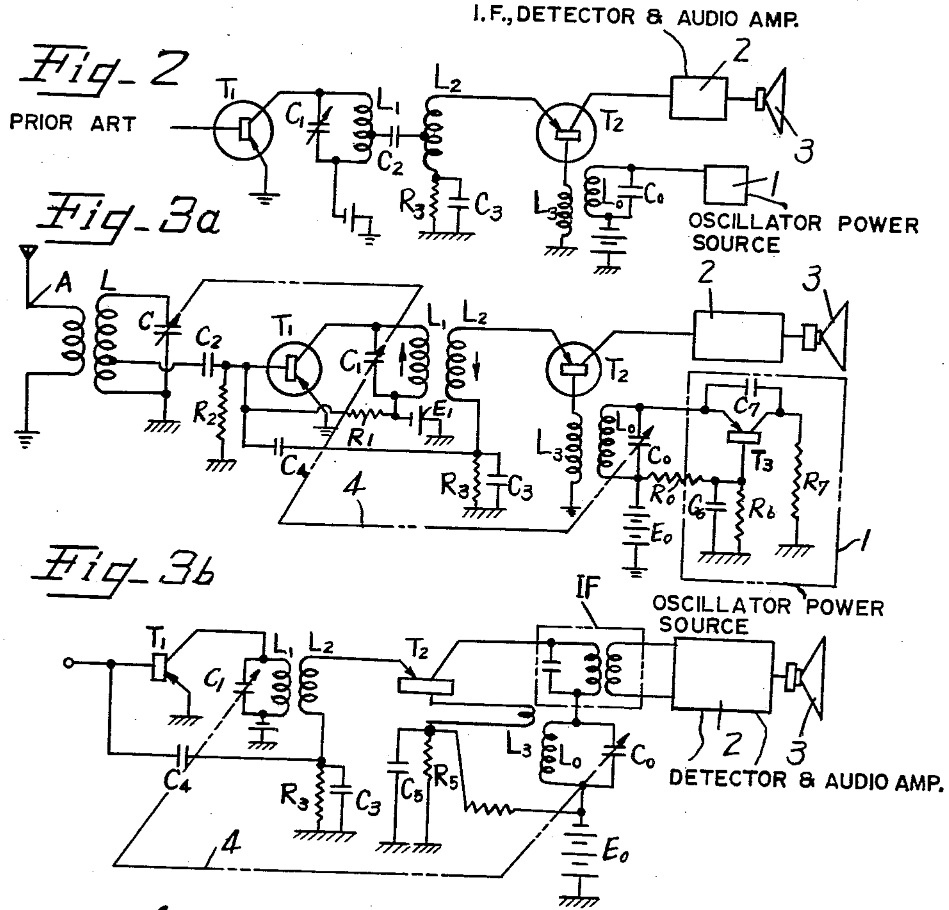
Fig 2 PRIOR ART, Fig 3a, Fig 3b
FIG. 2 is a diagram of a heretofore known transistor receiver circuit employing bridge balancing principle, the circuit being similar to that of FIG. 1, except that the transistors are used instead of vacuum tubes.

Assuming that this arrangement is applied to a transistor circuit, and the vacuum tubes $V_1$ and $V_2$ of FIG. 1 are interchanged by transistors $T_1$ and $T_2$ respectively, then the circuit arrangement will become as shown in FIG. 2. The combination of resistance $R_3$ and capacitance $C_3$ connected to the transformer winding $L_2$ is so selected that it will draw a correct emitter current and still have the equivalent value to the input impedance of the transistor $T_2$. The local oscillation circuit $L_0C_0$ is coupled to the transistor $T_2$ by means of an inductance $L_3$ which is connected in series to the base circuit of the transistor $T_2$. Such circuit arrangement must operate in the same way as the circuit shown in FIG. 1 using vacuum tubes, and the interfering radiation should be prevented.

But in the case of transistor receiver circuit as shown in FIG. 2, it is very difficult to maintain a constant local oscillation voltage in the receiving frequencies higher than 70 megacycles, and therefore, the input impedance of the transistor $T_2$ varies according to the amplitude of the local oscillation voltage applied to it, for instance, the input capacitance is proportional to its emitter current and the input resistance is inversely proportional to about ½ power of the emitter current. When the local oscillation circuit $L_0C_0$ is located on the collector side of the transistor $T_2$, the parallel impedance varies according to the variation of capacitance $C_0$, so that the input impedance of the transistor $T_2$ also varies. As a result, the input impedance of the transistor is subject to the amplitude variation of the local oscillation voltage and it can not take a definite value, so that the balance of the bridge is broken. In vacuum tube circuit the input capacitance of the tube $T_2$ is practically constant so that the equilibrium of the bridge can not be broken. The results of experiment are shown by the curves B and C of FIG. 5.

According to this invention, the transistor is used, as shown in FIG. 3, in the mixing circuit or frequency converting circuit as above described without using a system of equilibrium bridge on the input side, in such a manner that the local oscillation voltage induced in the input circuit of the high frequency amplifying stage preceding the mixing or frequency converting stage through the high frequency transformer windings $L_1$ and $L_2$ and the high frequency amplifying transistor $T_2$, is cancelled by the oscillation voltage derived from a part of the biasing circuit of said mixing or frequency converting circuits, which is fed back to the input side of the high frequency amplifying stage.

FIG. 3–*a* illustrates an embodiment of this invention, wherein the transistor $T_2$ is used as a mixing transistor and the frequency is converted by mixing the input signal and local oscillation voltage in the transistor $T_2$.

Referring to FIG. 3–*a*, a receiving antenna A; a tuning coil L; a variable condenser C connected to said tuning coil L; a grid condenser $C_2$ and a grid biasing resistance $R_2$ respectively provided in the input circuit of the frequency amplifying transistor $T_1$; a mixing or frequency converting transistor $T_2$; primary and secondary windings $L_1$ and $L_2$ of a high frequency transformer connected between these transistors $T_1$ and $T_2$; condenser $C_1$, bias resistance $R_1$ and bias source $E_1$ coupled between the transformer winding $L_1$ and the transistor $T_1$; a resistance capacitance combination $R_3C_3$ connected to one end of the winding $L_2$ to constitute a biasing circuit of the transistor $T_2$ are connected as shown. The parallel connected condenser and inductance $C_0L_0$ constitute a local oscillation circuit coupled to the inductance $L_3$ connected to the base electrode of the transistor $T_2$; an electric source $E_0$ and resistance $R_0$ respectively are connected thereto. $T_3$, $C_6$, $R_6$, $C_7$ and $R_7$ represent respectively a transistor, parallel connected condenser and resistance, biasing condenser and emitter resistance of $T_3$, and so connnected as to constitute an operating electric source 1 of the local oscillation circuit $L_0C_0$. A part of receiving circuit 2 is connected between the output side of the transistor $T_2$ and a loud speaker 3. According to this invention the bias circuit $R_3C_3$ connected to one end of the secondary winding $L_2$ of the high frequency transformer is connected through a small capacitance $C_4$ to the input side of the high frequency amplifying transistor $T_1$. The condenser $C_4$ should have a sufficiently small static capacitance in order to prevent the short circuiting of the bias voltage source for the transistors $T_1$ and $T_2$ and in order not to give adverse effects to the input impedance of the transistor $T_1$. The chain or broken line represented by the reference numeral 4 illustrates a means for ganging the condensers C and $C_1$ in the input and output tuning circuits of the high frequency amplifying stage and the local oscillator tuning condenser $C_0$.

FIG. 3–*b* illustrates the case when the local oscillation and mixing are effected in a single transistor $T_2$. The same reference characters and numerals as in FIG. 1 illustrate the same or equivalent parts. IF represents an intermediate frequency transformer and $E_0$ represents an electric source of the local oscillator and mixer circuit. $R_5$ and $C_5$ represent a bias resistance and a bias condenser respectively.

The function of the system according to this invention will be explained referring to the above cases. The local oscillation voltage generated in the $L_0C_0$ circuit is applied to th ebase circuit of the transistor $T_2$ and appears on the secondary winding $L_2$ of the high frequency transformer. The oscillation voltage induced in the transformer primary winding $L_1$ is applied to the collector circuit of the transistor $T_1$ and it appears on the input side through the interior of the transistor $T_1$.

On the other hand, the local oscillation voltage appears, though it is very small, across the terminals of the bias circuit $R_3C_3$ of the mixing transistor $T_2$ and it is fed back to the input side of the high frequency amplifying transistor $T_1$ through the condenser $C_4$. In order to couple the windings $L_1$ and $L_2$ in the reverse phase it can be varied as desired according to the selection of the constant of the biasing circuit $R_3C_3$.

The phase relation can be determined in accordance with the manner of connection of the transistor and the windings $L_1$ and $L_2$ of the transformer.

For the sake of explanation, now consider the case when the circuit of transistor $T_1$ is a grounded emitter type, and is operated at a frequency lower than the cut-off frequency, then the equivalent circuit of the interfering radiation preventive circuit will become as shown in FIG. 6–*a*, wherein if $E'_0$ is assumed to be a part of the local oscillation voltage induced in the transformer winding $L_2$ and condenser $C_3$ in series, the terminal voltage $EL_2$ of the winding $L_2$ lags 90 degrees behind $E'_0$, while the terminal voltage $EC_3$ of the condenser $C_3$ advances 90 degrees. Since $R_3$ is several thousand megohms and the condenser $C_3$ is several hundred picofarads, the capacitance $C_3$ only is taken into consideration as the constant of the emitter circuit $R_3C_3$ of the transistor $T_2$, in the ultra short wave band used in this invention, and the terminal voltages $EL_2$ and $EC_3$ may be considered to have 180 degrees phase difference, though there is a little phase lag which acts favourably for the compensation of interfering radiation as explained later.

When the transformer windings $L_1$ and $L_2$ are wound in the same direction, the phase of the voltage $EL_1$ induced in the winding $L_1$ differs by about 180 degrees from the induced voltage $EL_2$ in the winding $L_2$. Actually, the primary winding $L_1$ and the tuning condenser $C_1$ are tuned to the receiving frequency, and therefore they are not tuned to the local oscillation frequency. If the frequency of the local oscillation is made lower than that of the incoming wave the tuning circuit $L_0C_0$ will exhibit a somewhat inductive load, and the phase difference from the tuning point phase angle is about 30 degrees. If the intermediate frequency is 10.7 megacycles and the incoming wave is 85 megacycles, the phase difference is about 30 degrees as above explained.

In transistor amplifiers having grounded emitter, the phase of the input voltage and the output voltage differ by 180 degrees for the resistance load as is well known, so that there occurs the voltage $E'_{in}$ fed back to the input side by $EL_1$ differing about 180 degrees in phase from the phase of $EL_1$ as shown in the vector diagram of FIG. 6–*b*.

On the other hand, the terminal voltage of the condenser $C_3$ is fed back to the input side by the coupling condenser $C_4$, so that the voltage $E'_{in}$ is induced on the input side of the transistor $T_1$, and the voltages $E'_{in}$ and $E''_{in}$ can be made equal in amplitude and opposite in phase as shown in the drawing so that they cancel with each other. In this case, since the phase difference of the voltages $E'_{in}$ and $E''_{in}$ is not exactly 180 degrees, there is a little residual component, but it does not cause troubles in practice as it has been sufficiently attenuated. By selecting the values of the resistance $R_3$ and capacitance $C_3$ properly, the vector of $EC_3$ may act to lag behind so that the phase difference of about 30 degrees can be regulated.

In case of base grounded transistor high frequency amplifier, the similar cancellation can be effected by connecting the windings $L_1$ and $L_2$ in the reverse manner.

Figure 4:
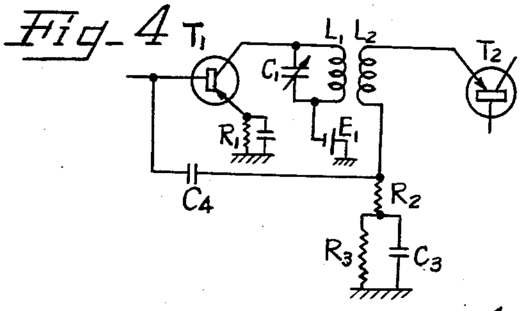

Nextly, the amplitude of feed back components can be adjusted either by connecting a proper impedance $R_2$ in series to the bias circuit $R_3C_3$ as shown in FIG. 4 or by a tapping on the resistance $R_3$.

The system of this invention is basically a cancellation of an interfering voltage and a compensating voltage and does not use bridge balance principles. There is no reduction in the preventive effect, due to the variation of the oscillation voltage depending on the operating frequency of the receiver, and therefore almost uniform and high attenuation of interfering radiation can be obtained.

FIG. 5 illustrates the results of experiment, wherein the curve A shows the local oscillation voltage level appearing on the input terminal of the receiver, when there is no preventive circuit at all, and the curve C represents the same occurring in the circuit of FIG. 2. Thus when a bridge is constituted of inductances, there occurs such a point where the effect is reduced by the carrier wave. The curve B illustrates the case when resistances are used instead of $L_2$ showing approximately the same inclination as of the curve C. The curve D illustrates the case of this invention wherein almost uniform attenuation of at least 25 dbs or more can be obtained for carrier frequencies of 76 to 96 megacycles.

The balancing of the bridge circuit is considerably difficult to attain in practice on ultra high frequency region.

According to the present invention no bridge circuit is used to prevent interfering radiation of local oscillation, and the induced voltage in the biasing circuit of the mixer transistor is fed back to the input side through a small capacitance, so that there is no need of minute regulation, and it is very convenient in practice, and moreover there is no lowering of the input impedance of the transistor $T_1$ since it is fed back by means of the small capacitance and also no adverse effect is given to the operation of the transistor $T_2$ since the biasing circuit is utilized to take out the necessary compensating voltage.

According to the results of experiments, the sensitivity of the receiver as shown in FIG. 3–*a* of the circuit of this invention is practically the same as that of the receiver which has no preventive circuit. While the sensitivity of the receiver as shown in FIG. 2 is 8 to 10 dbs less than that of the receiver as shown in FIG. 3–*a*.

By the reasons as hereinbefore fully described, the system of this invention is especially effective for preventing interfering radiation when it is applied to the FM transistor receivers of receiving frequencies higher than 70 megacycles over which the interfering radiation has been very strong otherwise.

What we claim is:

1. A circuit for reducing interfering local oscillation radiation in superheterodyne transistor receivers, comprising a transistor amplifying stage, a frequency mixer stage including a transistor having an input electrode and a pair of further electrodes, means for coupling output signals developed by said amplifying stage to said frequency mixer stage, a local oscillator connected to supply local oscillations to one of said pair of electrodes of said frequency mixer stage transistor, a bias network connecting said input electrode of said converter stage transistor to a reference potential through at least a part of said means for coupling whereby local oscillator signals are induced in said bias network through at least the interelectrode capacity of said mixer stage transistor, and a capacitor for coupling local oscillator signals developed in said bias network to an input circuit of said amplifier stage.

2. The circuit as set forth in claim 1, said means for coupling between stages comprising a transformer, said bias network comprising a capacitance and a resistor in parallel and connected between the reference potential and the secondary winding of said transformer.

3. The combination according to claim 1 wherein said mixer stage and said local oscillator are combined in a converter stage employing said transistor as the active element of said converter stage.

References Cited in the file of this patent

UNITED STATES PATENTS

| | | |
|---|---|---|
| 1,743,148 | Landon | Jan. 14, 1930 |
| 2,039,634 | Clay | May 5, 1936 |
| 2,856,520 | Lin | Oct. 14, 1958 |

FOREIGN PATENTS

| | | |
|---|---|---|
| 921,273 | Germany | Dec. 13, 1954 |